(12) United States Patent
Bogner

(10) Patent No.: US 11,049,746 B2
(45) Date of Patent: Jun. 29, 2021

(54) SUBSTRATE CASSETTE

(71) Applicant: SUSS MicroTec Lithography GmbH, Garching (DE)

(72) Inventor: Bernhard Bogner, Garching (DE)

(73) Assignee: SUSS MICROTEC LITHOGRAPHY GMBH

( * ) Notice: Subject to any disclaimer, the term of this patent is extended or adjusted under 35 U.S.C. 154(b) by 0 days.

(21) Appl. No.: 16/704,875

(22) Filed: Dec. 5, 2019

(65) Prior Publication Data

US 2020/0194282 A1 Jun. 18, 2020

(30) Foreign Application Priority Data

Dec. 12, 2018 (NL) ..................................... 2022185

(51) Int. Cl.
*H01L 21/673* (2006.01)
(52) U.S. Cl.
CPC ................................ *H01L 21/6732* (2013.01)
(58) Field of Classification Search
CPC ........... H01L 21/6732; H01L 21/67326; H01L 21/6734; H01L 21/67379; H01L 21/673; H01L 21/67383
USPC .................................................. 206/711, 710
See application file for complete search history.

(56) References Cited

U.S. PATENT DOCUMENTS

| | | | | |
|---|---|---|---|---|
| 5,858,103 A | * | 1/1999 | Nakajima | ......... H01L 21/67303 118/728 |
| 5,944,194 A | * | 8/1999 | Gregerson | ........ H01L 21/67369 206/711 |
| 2003/0052039 A1 | | 3/2003 | Cu, Jr. | .......................... 206/711 |
| 2005/0148455 A1 | | 7/2005 | Narendar et al. | ............... 501/88 |
| 2009/0194456 A1 | * | 8/2009 | Fuller | ............... H01L 21/67383 206/711 |
| 2012/0189408 A1 | | 7/2012 | Bonora | ..................... 414/222.01 |
| 2013/0082015 A1 | | 4/2013 | Zhao | .......................... 211/41.18 |
| 2014/0356107 A1 | | 12/2014 | Bonora | ......................... 414/288 |
| 2015/0083640 A1 | | 3/2015 | Gregerson et al. | ........... 206/711 |
| 2017/0287758 A1 | * | 10/2017 | Kanamori | ......... H01L 21/67383 |

FOREIGN PATENT DOCUMENTS

JP 2000332097 11/2000 ............. B65D 85/57

* cited by examiner

*Primary Examiner* — King M Chu
(74) *Attorney, Agent, or Firm* — Hayes Soloway P.C.

(57) ABSTRACT

A substrate cassette for housing several substrates stacked on top of each other, in particular wafers, has a housing that comprises a first side and a second side that is parallel to the first side, wherein at least an elongated first support is provided for a substrate within the housing between the sides, said support being spaced apart at least in sections from the first side, wherein the first side is closest to said at least one first support.

21 Claims, 2 Drawing Sheets

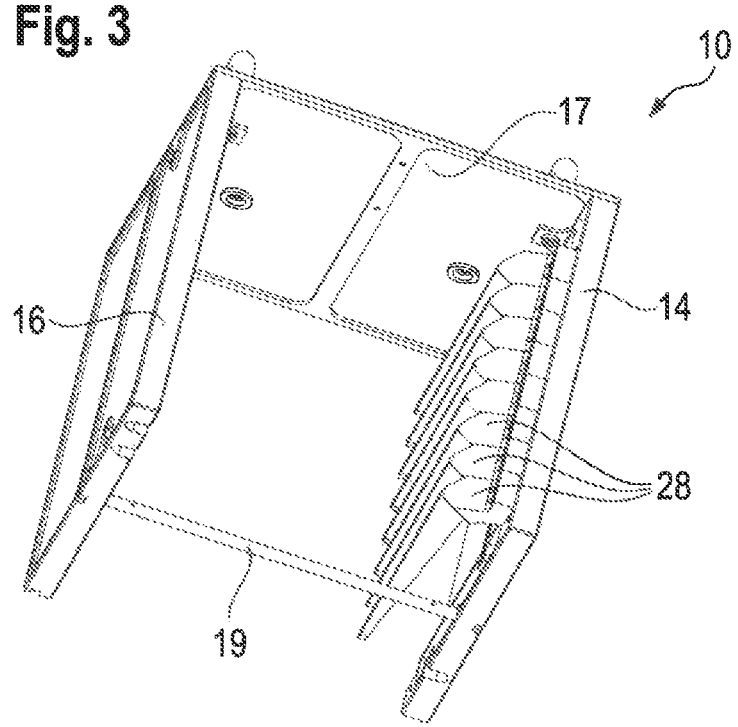
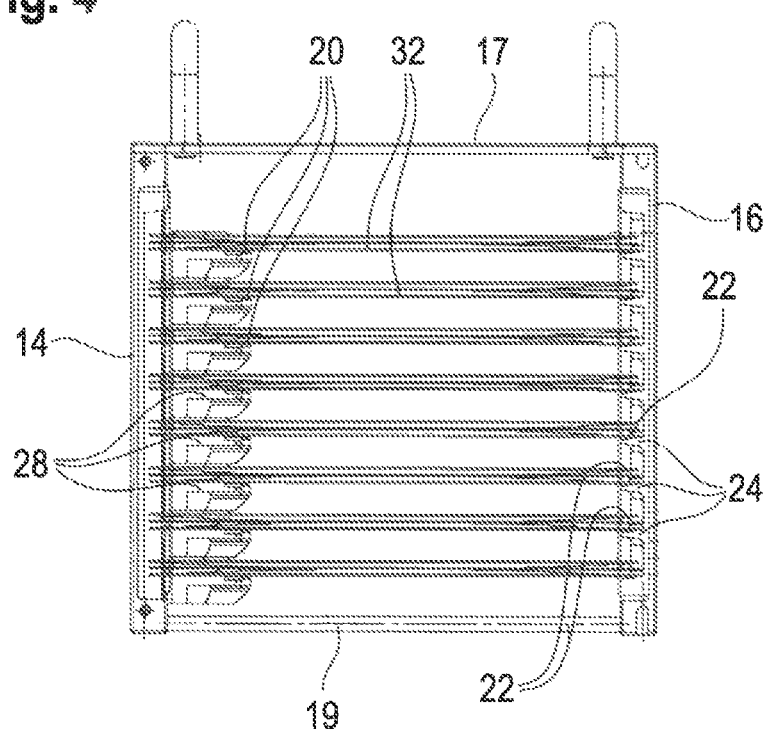

SUBSTRATE CASSETTE

FIELD OF THE DISCLOSURE

The invention concerns a substrate cassette for housing several substrates stacked on top of each other, in particular wafers.

BACKGROUND

Substrate cassettes for housing substrates stacked on top of each other are well-known. Such substrate cassettes normally have several slots, wherein one substrate can be housed in each slot. The well-known substrate cassettes are particularly suitable for housing planar substrates. If the substrates are however curved, in some cases, these cannot be positioned stably in a defined position in a slot in the substrate cassette. Providing a stable support is particularly difficult in the case of multi-curved substrates. The form of a multi-curved substrate resembles the form of a potato chip. Owing to the curvature that resembles the form of a potato chip, the distance between two substrates is variable depending on the rotational position of the substrate in the substrate cassette, which makes removing a substrate difficult, particularly if a random removal from any slot is desired.

It is however necessary that the substrates are stored as parallel to each other as possible in a defined position in the substrate cassette. This is the only way to ensure that there is no collision between the end effector and the substrates, which could potentially damage the substrates, when removing the substrates by means of an end effector.

SUMMARY

Thus, there is a need to provide a substrate cassette in which curved substrates can be housed stacked as parallel to each other as possible.

This object is solved according to the invention by means of a substrate cassette for housing several substrates stacked on top of each other, in particular wafers, with a housing comprising a first side and a second side that is parallel to the first side, wherein at least an elongated first support is provided for a substrate within the housing between the sides, said support being spaced apart at least in sections from the first side, wherein the first side is closest to said at least one first support. In particular, the first support is positioned closer to the first side as the second side.

The first support is therefore not adjacent to the first side so that the substrate is not supported on its outside edge by the support, but in a region that is at a distance from the outside edge of the substrate. This means that a region of the substrate located between the first support and the first side of the housing is exposed and does not come into contact with the first support. Thus, a multi-curved substrate can be supported at a total of at least three support points. In this way, it is possible to stack several substrates parallel to each other, even if these are curved or even multi-curved, wherein a deviation from an ideal position is minimized. Moreover, the substrates positioned in the substrate cassette can thus be detected by means of a light barrier.

The sides can be designed as side panels comprising a continuous panel area. It is however conceivable that at least one side does not have a continuous panel area and/or is designed, for example, as a frame. This enables material to be economized in the manufacture of the substrate cassette.

The housing can either be manufactured in one piece or can be assembled using several individual components. Thus, the housing can comprise an upper side in the form of a housing cover and/or an intermediate crosspiece in addition to both sides. In particular, the housing is an injection-molded part.

Instead of an intermediate crosspiece, the housing can also comprise a connecting panel that connects both sides.

A substrate is, for example, a wafer with a diameter of up to 450 mm, in particular with a diameter of up to 300 mm, preferably with a diameter between 50 mm and 200 mm. A curvature of the substrate, in particular a region with the largest bending of a substrate, can amount up to 10 mm, i.e. that the distance between the highest point of the substrate and the lowest point of the substrate in the axial direction of the substrate can amount to up to 10 mm. The maximum curvature can be even larger in the case of substrates with diameters of more than 450 mm.

On the second side, at least a second support can be positioned at the height of said at least one first support, wherein in each case a slot is defined by one of said at least one first support and said at least one second support. Thus, a substrate can be supported stably by means of the first and the second support if it is positioned in the substrate cassette.

Said at least one second support is, for example, spaced apart from the second side or is a support rail that comes into direct contact with the second side, in particular is molded directly on the second side. In the first case, the second support can be designed mirror inverted to the first support. In this case, there can be four support points between a substrate and a slot if there is a multi-curved substrate in the substrate cassette. In the second case, if the support is a support rail located directly on the second side, this results in three support points for a multi-curved substrate, thus enabling the substrate to be supported particularly stably. The existence of exactly three support points has the advantage that the substrate cannot tilt or rock in the substrate cassette. The support points are preferably located at the same height.

According to an embodiment, several slots arranged on top of each other can be provided, in particular wherein the supports of slots arranged on top of each other are spaced a maximum of 50 mm apart, in particular between 5 mm and 30 mm apart. As a result, as many substrates as possible can be housed in a substrate cassette. Selecting such a spacing between the slots thus makes it still possible to load or empty the substrate cassette by means of an end effector without any difficulties.

The distance between the first support and/or the second support of the slot and the respective nearest side is, for example, between 25 mm and 40 mm in size and/or at the most as large as half of the diameter of the substrate. In this way, a distance between the first and the second support that is too small can be avoided as this would result in the substrate being supported less stably.

Said at least one first support and/or said at least one second support can comprise a support line or a support area, in particular a support line or a support area forms the overall support. Support line or support area refers to the line/area along which a substrate can come into contact with the support. To this end, for example, the support line is designed in a straight line or the support area is designed on a plane. By providing a support line or support area, a substrate can rest on a support in different positions along the direction of a slot.

According to an embodiment, said at least one first support and/or said at least one second support extend parallel to or at an acute angle to the sides. This is understood to mean that at least one edge of the support or the support line extends parallel to or at an acute angle to the sides, in particular at an angle of up to 10°. Thus, an end effector can be moved in and out parallel or virtually parallel to the support in the substrate cassette. In this way, the handling or transport of the substrate is simplified with an end effector.

Said at least one first support and/or said at least one second support is provided, for example, on a support arm that extends from the support to the first side or to the second side accordingly. In particular, the support is only supported by the support arm. Using this support arm, it is possible to position the support in a defined position in the substrate cassette. The support is also supported by the support arm so stably that the support does not bend downwards under the weight of the substrate. In particular, the support is designed rigidly.

Viewed in a top view, a base area of the support arm can be larger than the area of the support. As the support can be a relatively small area, in particular a narrow area, it is advantageous if the base area of the support arm is larger in order to keep the support in a stable position. By having the base area of the support arm larger than the area of the support, the area of the support can thus be kept particularly small, which in turn enables a substrate to be positioned in a defined position in the substrate cassette.

The support arm is preferably attached, in particular screwed, to the first side or to the second side accordingly. Thus, it is possible to dispense with a rear panel and/or front panel in the substrate cassette. In particular, a rear side and/or a front side of the substrate cassette can be completely open.

At least a part of the support arm can extend in a top view in a region in the direction of the slot between the first support and the rear side or front side of the substrate cassette. For example, the support can be adjacent to the support arm with its front end, in particular on the front end facing the rear side of the substrate cassette. Thus, an impediment to the operation of an end effector that removes substrates from the substrate cassette or places them there can be prevented.

A free space is preferably provided between the support and the side nearest to the support. Thus, the substrate can extend downwards on the side of the support in the case of a curved substrate, in particular in the region between the support and the nearest side.

According to an embodiment, the support arm has a triangular base area, in particular wherein the base area tapers towards a free end of the support arm. Thus, the support arm has the stability needed and at the same time is lightweight. In particular, such a form of the support arm prevents that the support arm or the support alone slopes downwards towards the free end of the support arm as a result of the weight of the support arm.

The support is preferably the highest area of the support arm in a mounted position of the support arm in the substrate cassette. This ensures that a substrate also actually rests on the support and not on any other area of the support arm.

If several support arms are provided, the support arms can be combined as one piece, in particular in the form of a support comb. Thus, handling is simplified during assembly and the work need for the assembly is greatly reduced.

To be able to use the substrate cassette for various formed substrates flexibly, the support is preferably height adjustable relative to the side and/or the support arm.

DESCRIPTION OF THE DRAWINGS

Additional advantages and features of the invention can be found in the following description and in the subsequent drawings to which reference is made. In the drawings:

FIG. 3 shows the substrate cassette from FIG. 1 in another isometric view, and FIG. 4 shows a cross section that is perpendicular to the cross section in FIG. 2.

DETAILED DESCRIPTION

Figure 1:
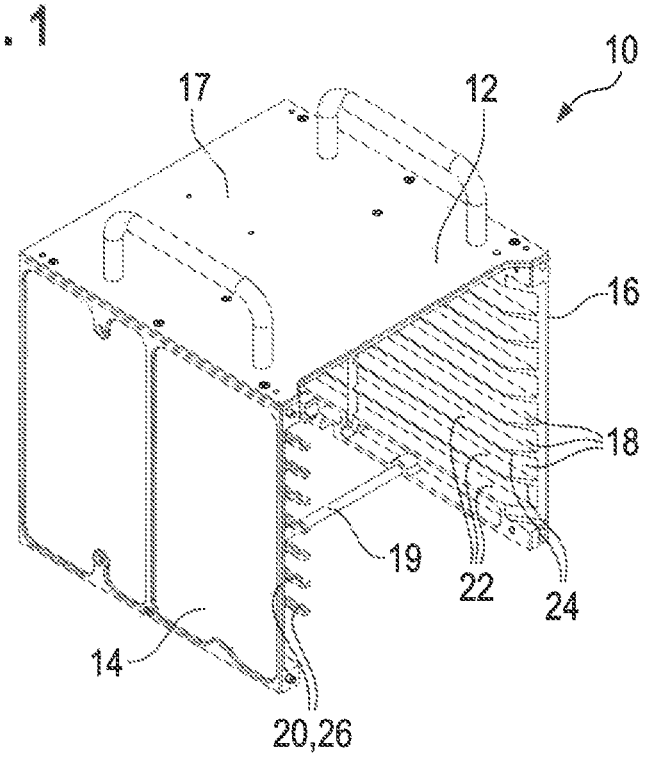
FIG. 1 shows a substrate cassette according to the invention in an isometric view.

FIG. 1 shows a substrate cassette 10 for housing several substrates stacked on top of each other, in particular wafers.

The substrate cassette 10 has a housing 12 comprising a first side 14 and a second side 16 that is parallel to the first side 14 which are each formed by a continuous side panel. The side panels are screwed to an upper side 17 of the substrate cassette 10. It is however conceivable that the housing 12 of the substrate cassette 10 is manufactured as one piece by injection molding.

To support the sides 14, 16 stably to each other, an intermediate crosspiece 19 is provided that is connected to the sides 14, 16 and extends on the bottom end of the sides 14, 16 from the first side 14 to the second side 16. The intermediate crosspiece 19 can moreover be used for the purpose of attaching or operating a sensor that detects the presence of the substrate cassette 10 in a system.

The intermediate crosspiece 19 can be produced as a separate part or designed as a one piece with the housing 12.

The substrate cassette 10 further comprises several slots 18 that are each defined by at least one first support 20 and at least one second support 22 that are at the same height. The supports 20, 22 are thus located within the housing 12. One substrate can be housed in the substrate cassette 10 per slot 18, said substrate being introduced in the slot 18 via the front side of the substrate cassette 10.

A support 20 is merely understood to mean a support area or a support line, regardless of its mechanical attachment.

Figure 2:
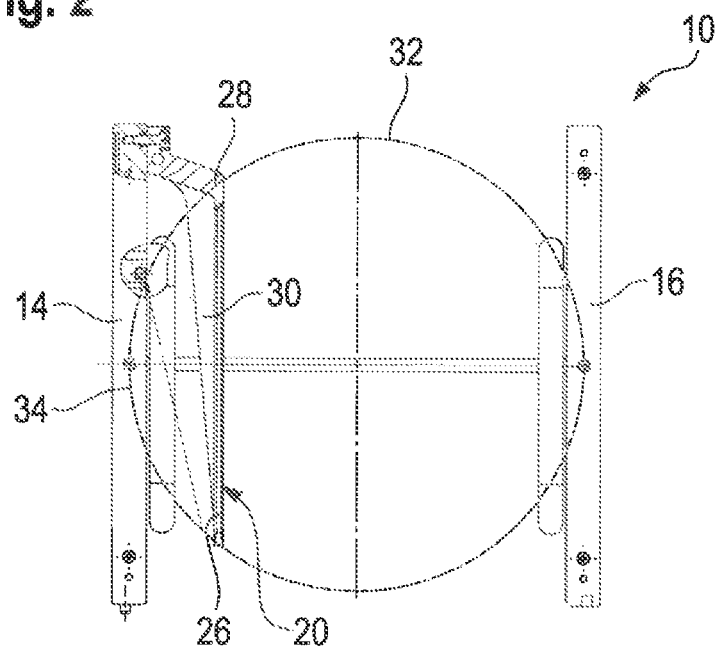
FIG. 2 shows a cross section through the substrate cassette from FIG. 1.

The first support 20 is elongated and extends parallel to the first side 14 in the shown embodiment, as can be seen in FIG. 1, but even better in FIG. 2. To this end, the support 20 is designed relatively narrowly, for example, it is a maximum of 2 mm in width.

Moreover, the first support 20 is at least spaced apart in sections from the first side 14, wherein the first side 14 is closest to the first support 20, i.e. that the first support 20 is closer to the first side 14 than to the second side 16.

In each case, the second support 22 is formed by a support rail 24 that is in direct contact with the second side 16. More specifically, the support rail 24 is molded onto the second side 16. Alternatively, the second support 22 can be designed as a mirror image to the first support 20.

To create several slots 18, several first supports 20 and several second supports 22 are located in the housing 12 in alignment above each other, in particular spaced at a maximum distance of 50 mm, in particular 5 mm to 30 mm.

It is also conceivable, that the support arms 28 are not designed separately and attached, but rather several or all support arms 28 are produced from a single piece, in particular in the form of a support comb.

The support arms 28 form in this case support teeth. The number of support teeth would thus be identical to the number of molded second supports 22 on the opposite side 16.

FIG. 2 shows cross section through the substrate cassette 10, wherein the form and the position of the first support 20 is shown more clearly in FIG. 2 as in FIG. 1.

As can be seen in FIG. 2, the first support 20 is realized in the shown embodiment by a support area 26 that extends parallel to the first side 14.

As an illustration, the outline of a substrate 32 is drawn with a dashed line in FIG. 2.

The distance of the first support 20 to the first side 14 is for example between 25 mm and 40 mm. The distance of the first support 20 to the first side 14 should be at the most as large as half the diameter of a substrata 32.

To place the first support 20 in a defined position, the first support 20 is designed on a support arm 28 that extends from the support 20 to the first side 14.

The support arm 28 is attached, in particular screwed, in turn onto the first side 14. Thus, the support arm 28 is designed more massively in the region of the attachment in particular in a region of the support arm 28 contiguous with the first side 14, than in the remaining area.

The support arm 28 is for example an injection molding part, in particular made of plastic.

The support 20 itself is the uppermost area of the support arm 28 if this is installed in the substrate cassette 10. Thus, a substrate 32 always rests on the support 20 in the substrate cassette 10. Furthermore, this results in a free space between the support 20 and the nearest side 14.

As can be seen from FIG. 2, a base area 30 of the support arm 28 is larger than the area of the support 20.

More specifically, the support arm 28 has a triangular base area 30. In this case, the base area 30 tapers to a point in the direction towards a free end of the support arm 28 or the support 20. As a result, the support arm 28 is as a whole particularly stable, in particular the dead weight of the support arm 28 is distributed advantageously. The purpose of this weight distribution is to ensure that the support 20 is positioned as horizontally as possible in the substrate cassette 10 and does not hang down towards the free end due to the dead weight of the support arm 28.

The shown embodiment illustrates only one of many conceivable possibilities for designing the support arm 28. It is for example also conceivable to design the support arm as a rail with a mostly constantly extending L-formed profile that is directed with its short leg towards the first side 14, wherein the support 20 is formed on an upper front end of the long leg.

FIG. 3 shows the substrate cassette 10 in another isometric view, in which the rear side of the substrate cassette 10 can be seen.

It is clear in this view that several support arms 28 are located directly above each other in the housing 12. In particular in direct contact with each other, in order to form several slots 18.

If both the first supports 20 and the second supports 22 are formed on a support arm 28, it is conceivable that the supports 20, 22 are height adjustable relative to the sides 14, 16 and/or relative to the support arm 28. The same is true if the support arms 28 are molded on a single-piece support comb.

FIG. 4 shows a section perpendicular to the cross section from FIG. 2, in particular a section perpendicular to the direction of a slot.

In this depiction, the slots 18 are occupied with substrates 32 that are resting on the supports 20, 22.

The substrates 32 are supported using the first support 20 at a distance to an outside edge 34 of the substrate 32.

In contrast, the substrate 32 rests on the second support 22 with its outside edge 22. In this way, both flat and curved substrates 32 can be supported reliably and parallel to each other.

The depiction of the substrate 32 in FIG. 4 is not necessarily realistically accurate and serves only as an illustration. Moreover, several differently formed substrates 32 are each illustrated in a slot 18 in FIG. 4. However, a slot 18 is actually always only occupied by one substrate 32.

The invention claimed is:

1. A substrate cassette for housing several substrates stacked on top of each other comprising a housing that comprises a first side and a second side that is parallel to the first side, wherein at least an elongated first support is provided for a substrate within the housing between the sides, said first support being in part spaced from the first side, wherein the first side is closest to said at least one first support is closer to the first side than to the second side, and wherein the at least one first support is provided on a support arm that extends from the support to the first side.

2. The substrate cassette according to claim 1, wherein the substrates are wafers.

3. The substrate cassette according to claim 1, wherein on the second side, at least a second support is positioned at the height of said at least one first support, wherein in each case a slot is defined by one of said at least one first support and said at least one second support.

4. The substrate cassette according to claim 3, wherein said at least one second support is spaced apart from the second side or is a support rail that comes into direct contact with the second side.

5. The substrate cassette according to claim 4, wherein said at least one second support is molded directly on the second side.

6. The substrate cassette according to claim 3, wherein several slots arranged on top of each other are provided.

7. The substrate cassette according to claim 6, wherein the supports of slots arranged on top of each other are spaced a maximum of 50 mm apart.

8. The substrate cassette according to claim 7, wherein the supports of slots arranged on top of each other are spaced between 5 mm and 30 mm apart.

9. The substrate cassette according to claim 1, wherein the distance of the first support to the first side is at least one of between 25 mm and 40 mm in size and at the most as large as half of the diameter of a substrate intended to be received in the substrate cassette.

10. The substrate cassette according to claim 1, wherein at least one of said at least one first support and said at least one second support comprise a support line or a support area.

11. The substrate cassette according to claim 1, wherein at least one of said at least one first support and said at least one second support extend parallel to or at an acute angle to the sides.

12. The substrate cassette according to claim 3, wherein the at least one second support is provided on a support arm that extends from the support to the second side.

13. The substrate cassette according to claim 1, wherein the support arm is attached to the first side or to the second side accordingly.

14. The substrate cassette according to claim 1, wherein, viewed in a top view on the support arm, at least a part of the support arm extends in a region between the first support and the rear side or front side of the substrate cassette with respect to an insertion direction.

15. The substrate cassette according to claim 1, wherein the support arm has a triangular base area.

16. The substrate cassette according to claim 1, wherein the support is located at an uppermost surface of the support arm when the support arm is in a mounted position in the substrate cassette.

17. The substrate cassette according to claim 1, wherein several support arms are provided, wherein the support arms are designed as one piece.

18. The substrate cassette according to claim 17, wherein the support arms are combined in the form of a support comb.

19. The substrate cassette according to claim 1, wherein the support is height adjustable relative to at least one of the side and the support arm.

20. A substrate cassette for housing several substrates stacked on top of each other comprising a housing that comprises a first side and a second side that is parallel to the first side, wherein at least an elongated first support is provided for a substrate within the housing between the sides, said first support being in part spaced from the first side, wherein the at least one first support is closer to the first side than to the second side, and wherein the support is height adjustable relative to the first side.

21. A substrate cassette for housing several substrates stacked on top of each other comprising a housing that comprises a first side and a second side that is parallel to the first side, wherein at least an elongated first support is provided for a substrate within the housing between the sides, said first support being in part spaced from the first side, wherein the at least one first support is closer to the first side than to the second side, and wherein the at least one first support is provided on a support arm that is fastened to the first side at an axial end of the support arm.

* * * * *